(12) United States Patent
Gravermann et al.

(10) Patent No.: US 10,955,442 B2
(45) Date of Patent: Mar. 23, 2021

(54) ELASTIC SLEEVE FOR A POWER CONDUCTOR

(71) Applicant: 3M INNOVATIVE PROPERTIES COMPANY, St. Paul, MN (US)

(72) Inventors: Mark Gravermann, Erkelenz (DE); Gunther A. J. Stollwerck, Krefeld (DE); Michael H. Stalder, Uedem (DE); Gerhard Lohmeier, Cologne (DE); Bernd Schubert, Cologne (DE); Rainer Reeken, Dormagen (DE); Jens Weichold, Erkelenz (DE)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 207 days.

(21) Appl. No.: 16/087,768

(22) PCT Filed: Dec. 23, 2016

(86) PCT No.: PCT/US2016/068492
§ 371 (c)(1),
(2) Date: Sep. 24, 2018

(87) PCT Pub. No.: WO2017/164952
PCT Pub. Date: Sep. 28, 2017

(65) Prior Publication Data
US 2019/0086444 A1  Mar. 21, 2019

(30) Foreign Application Priority Data

Mar. 23, 2016 (EP) .................................. 16161882

(51) Int. Cl.
*G01R 15/06* (2006.01)
*G01R 19/00* (2006.01)
(Continued)

(52) U.S. Cl.
CPC ......... *G01R 15/06* (2013.01); *G01R 19/0084* (2013.01); *H02G 15/1806* (2013.01);
(Continued)

(58) Field of Classification Search
CPC .... G01R 15/06; G01R 19/00; G01R 19/0084; H02G 15/18; H02G 15/1806; H05K 1/18;
(Continued)

(56) References Cited

U.S. PATENT DOCUMENTS

| 5,107,201 A | 4/1992 | Ogle |
|---|---|---|
| 5,986,207 A | 11/1999 | Uhlenhuth |

(Continued)

FOREIGN PATENT DOCUMENTS

| CA | 2522912 | 3/1998 |
|---|---|---|
| CN | 201229376 | 4/2009 |

(Continued)

OTHER PUBLICATIONS

Espacenet Translate DE2847227A1 (Year: 1980).*
(Continued)

*Primary Examiner* — Farhana A Hoque
*Assistant Examiner* — Courtney G McDonnough
(74) *Attorney, Agent, or Firm* — Gregg H. Rosenblatt

(57) ABSTRACT

Elastic sleeve (1) for electrically insulating a HV/MV power conductor in a power network, comprising a) a shrinkable or expandable elastic sleeve body (10); b) a receiving space (20) in the sleeve body, for receiving the power conductor; c) a cavity (30) formed in the sleeve body; and d) a divider assembly (40), arranged, at least partially, in the cavity and comprising a plurality of discrete impedance elements, operable as a voltage divider for sensing a voltage of an inner conductor of the power conductor.

20 Claims, 4 Drawing Sheets

Figure 1:
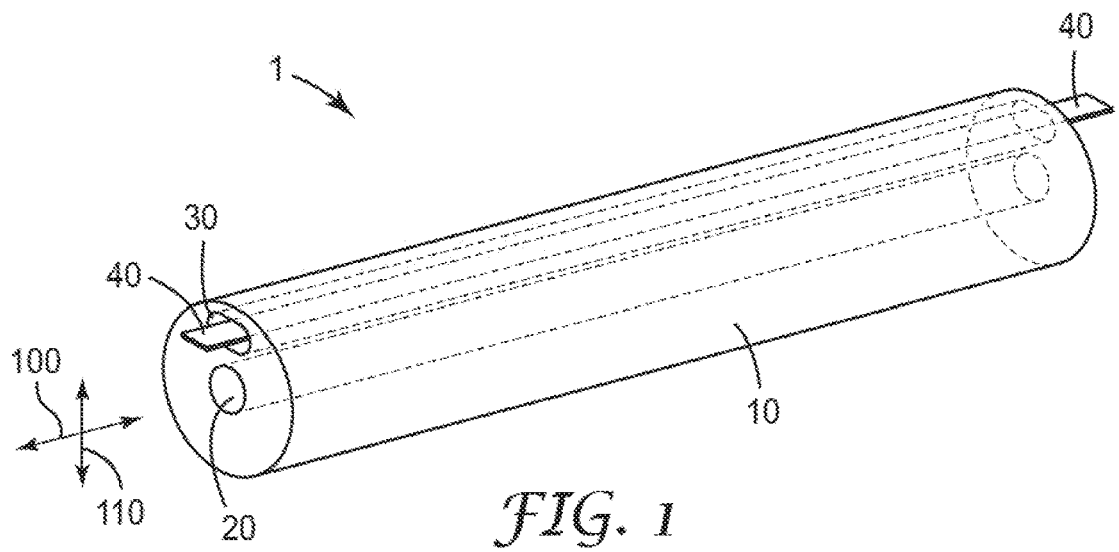

(51) Int. Cl.
  *H02G 15/18* (2006.01)
  *H05K 1/18* (2006.01)
(52) U.S. Cl.
  CPC ............ *H05K 1/189* (2013.01); *H02G 15/18* (2013.01); *H05K 2201/1003* (2013.01); *H05K 2201/10015* (2013.01); *H05K 2201/10022* (2013.01); *H05K 2201/10356* (2013.01)
(58) Field of Classification Search
  CPC ......... H05K 1/189; H05K 2201/10015; H05K 2201/10022; H05K 2201/1003; H05K 2201/10356
  USPC ....................................................... 324/126
  See application file for complete search history.

(56) References Cited

U.S. PATENT DOCUMENTS

| | | | |
|---|---|---|---|
| 6,814,588 | B1 | 11/2004 | Dunlavy |
| 7,838,770 | B2 | 11/2010 | Portas et al. |
| 9,960,530 | B2 | 5/2018 | Bolcato et al. |
| 2016/0005511 | A1* | 1/2016 | Gravermann ......... H02G 15/18 174/251 |
| 2016/0274149 | A1* | 9/2016 | Chatrefou ............. G01R 15/06 |

FOREIGN PATENT DOCUMENTS

| | | | | |
|---|---|---|---|---|
| CN | 202351297 | | 7/2012 | |
| DE | 134674 | | 3/1979 | |
| DE | 2847227 | A1 * | 5/1980 | ............ G01R 15/06 |
| DE | 3702735 | | 8/1988 | |
| DE | 19755887 | | 6/1999 | |
| DE | 102005036512 | | 2/2006 | |
| EP | 0172634 | | 2/1986 | |
| EP | 2472689 | | 7/2012 | |
| EP | 2508898 | | 10/2012 | |
| EP | 2605023 | | 6/2013 | |
| EP | 2605416 | | 6/2013 | |
| EP | 2763259 | | 8/2014 | |
| EP | 2819250 | | 12/2014 | |
| WO | WO 2014-120792 | | 8/2014 | |
| WO | WO 2016-045692 | | 3/2016 | |

OTHER PUBLICATIONS

"Type THV Precision High Voltage Divider Networks", Caddock Electronics, Inc., 2012, p. 1.
Fluri, "Applications of Low Power Current and Voltage Sensors", 21$^{st}$ International Conference on Electricity Distribution, 2011, pp. 1-4.
Minkner, "Low Power Voltage and Current Transducers for Protecting and Measuring Medium and High Voltage Systems", 2000, pp. 1-30.
International Search Report for PCT International Application No. PCT/US2016/068492, dated Mar. 14, 2017, 4 pages.
Search Report for CN Appl. No. 201680084013.9, dated Apr. 2, 2020, 1 pg.

* cited by examiner

ELASTIC SLEEVE FOR A POWER CONDUCTOR

The invention relates to voltage dividers for use with high-voltage (HV) or medium-voltage (MV) power conductors in power networks for distribution of electrical energy in national grids. It relates in particular to voltage dividers for sensing a voltage of such power conductors, which are accommodated in shrinkable or expandable, or generally elastic, elements for insulating such power conductors to kits of parts for assembling such elements, and to methods of applying such elements to power conductors.

Voltage dividers for sensing a voltage of an inner conductor of an HV/MV power cable are known, e.g. from the German patent application DE 3702735 A1. Voltage dividers can be formed by a plurality of resistors, capacitors or inductances. Resistors, capacitors and inductances are referred to as impedances in this disclosure.

Generally, one end of a voltage divider is electrically connected to the power conductor or otherwise kept on the high voltage to be measured, while the opposed end is held on lower voltage or on earth potential. Voltage dividers formed by a greater number of dividing elements which are connected in series are advantageous because the voltage drop across each of the dividing elements is smaller than with only two dividing elements, thus reducing electrical stress and the risk of failure.

An example of a voltage divider in a high voltage application is shown in the European patent application EP 2605023 A1, where the voltage divider comprises a plurality of resistive elements in an angled configuration. The group of elements is arranged on an insulating support the shape of which is such that the creepage distance of the support is equal to or longer than the sum of the creepage distances of the individual resistances. According to EP 2605023 A1, the divider can be embedded in insulating material, which is preferably a resin.

As indicated in EP 2605023 A1, appropriate electrical insulation of the voltage divider is important to prevent electric discharges. Suitable insulation can, for example, consist of a layer of non-conductive polymeric or rubber material enveloping the divider, of a thickness of several millimetres or a few centimetres, depending inter alia on the voltage to which the high voltage end of the divider is connected.

A voltage divider may be placed remote from the power conductor and the power cable. In such voltage dividers, capacitor electrodes of a high-voltage capacitor may be formed by two copper layers adhered to a glass plate forming the dielectric, while a low-voltage capacitor may be a regular off-the-shelf ceramic capacitor. Insulated wires may then be used to electrically connect the voltage divider to the high-voltage power conductor and to electrical ground. Such remote voltage dividers are not subjected to the temperature variations frequently occurring in power cables, which may increase their precision.

Mostly, however, a voltage divider is advantageously arranged close to the power conductor, one reason being to avoid having to electrically insulate those wires leading from the high-voltage power conductor to the high-voltage portion of the voltage divider. However, the geometric volume of a properly insulated voltage divider and the space required to accommodate it often make it difficult to install the divider close to the power conductor, which itself must be provided with insulation to prevent discharge.

It is known that an insulating sleeve can be designed to accommodate electric components. The European patent application EP 2 763 259 A1, for example, discloses an insulating sleeve with an electrode section and a PCB carrying a capacitive element of a voltage divider.

It appears desirable to provide an adequately insulated voltage divider that is easier to install close to the conductor than traditional voltage dividers. The present invention attempts to address this problem.

The invention provides an elastic sleeve for electrically insulating a HV/MV power conductor in a power network, the elastic sleeve comprising a) an elastic sleeve body for insulating the power conductor, the sleeve body being radially shrinkable around the power conductor or radially expandable when pushed over the power conductor;

b) a receiving space, formed in the sleeve body, for receiving a section of the power conductor such that the sleeve body surrounds the power conductor;

c) a cavity formed in the sleeve body and delimited by a cavity wall; and d) a divider assembly, arranged, at least partially, in the cavity and comprising a plurality of discrete impedance elements of which at least two of said impedance elements are electrically connected in series such as to be operable as a voltage divider for sensing a voltage of an inner conductor of the power conductor. For example, the divider assembly may include two or more, e.g., 2, 3, 4, 5, 10, 20, 30, 50, 100, 150, or even 200 or more, discrete impedance elements, of which at least two of said impedance elements are electrically connected in series. In at least one aspect, the plurality of discrete impedance elements may be electrically connected either in series, in parallel, or in a serial/parallel combination.

Traditional elastic insulating sleeves are available to provide insulation to a section of a power conductor. Such sleeves are easy and quick to apply around power conductors like insulated or bare cables, e.g. by pushing the elastic sleeve axially over the conductor and expanding it thereby, or e.g. by positioning a radially pre-expanded sleeve coaxially over the conductor and letting it shrink down over the conductor. According to the invention, such elastic sleeves can be provided with a cavity, formed in the sleeve body, in which a voltage divider (or more generally a voltage divider assembly or a divider assembly) can be accommodated. Such an elastic insulating sleeve is still easy to apply around a conductor. After its installation the sleeve body provides adequate insulation to the conductor and to the divider assembly and holds the divider assembly geometrically close to the power conductor in a space-saving manner.

Generally, elastic sleeves are used on MV/HV power cables for insulation purposes. They are easy to apply on cable ends and are cost-effective means to protect and insulate an axial section of a power cable or generally of a power conductor.

The word "sleeve" implies an element for arrangement circumferentially around a power conductor like, for example, a HV/MV power cable, an inner conductor of a HV/MV power cable, or a busbar.

A sleeve according to the invention may comprise a conductive shielding layer. The shielding layer may be arranged radially inward from the outer surface of the sleeve. It may thus be arranged inside the sleeve.

Alternatively, the shielding layer may form the radially outermost layer of the sleeve or of the sleeve body. The radially outer surface of the shielding layer may form the outer surface of the sleeve or the sleeve body.

The shielding layer may be arranged around the plurality of discrete impedance elements. This arrangement may reduce existing parasitic capacitances or keep them constant, which may increase the accuracy of the voltage sensing. The shielding layer may be electrically connected to ground or another potential in the system, such as, e.g., a high voltage potential.

Generally, the receiving space may have a cylindrical shape or a tubular shape. This may allow the sleeve to be pushed over an end of a cable and to be positioned on the cable.

A sleeve according to the invention has a sleeve body. The sleeve body of the elastic sleeve is radially expandable or radially shrinkable. The entire sleeve may be radially expandable or radially shrinkable. It can thus be positioned on the power conductor at any desired axial position. An expandable sleeve body or a shrinkable sleeve may be adapted for being pushed on a conductor into a desired position. A shrinkable sleeve body or a shrinkable sleeve may be adapted for being positioned on a cable in a desired position. They may be adapted for being shrunk down on the conductor in a desired position. Both expandable and shrinkable sleeve body or sleeves may be adapted such that, after expansion or after shrinking, friction between the sleeve body and the conductor keeps the sleeve in position on the conductor.

A sleeve according to this disclosure may be adapted to be used with medium-voltage or high-voltage power cables. Such cables typically have an inner conductor that carries the power. The inner conductor mostly has a circular cross section and extends in the length direction of the cable. The length direction of the inner conductor thereby defines axial directions of the cable and the sleeve, i.e. directions along the cable length. Directions perpendicular to the axial directions are radial directions, i.e. directions pointing away from the centre of the circular cross section of the inner conductor.

Typically, an electrically insulating layer, sometimes called the main insulation layer, is arranged around the inner conductor of the cable. The insulating layer is often arranged directly on the inner conductor, not taking into account any thin (semi-) conductive layer on the inner conductor that shall prevent air voids between inner conductor and main insulation—such a layer is considered to be part of the inner conductor. Most cables have further layers, arranged around the insulating layer, e.g. a semiconductive layer, a layer of shielding wires, and a cable sheath as outermost layer. The sleeve according to the invention may be adapted to be arranged around the inner conductor. For arranging the sleeve, a cable thus may need to be stripped, i.e. the cable sheath and any outer layers may have to be removed down to the inner conductor, such that the sleeve can be arranged around the inner conductor. In certain embodiments, the sleeve may be adapted to be arranged directly on the inner conductor.

In certain other embodiments, the sleeve may be adapted to be arranged directly on an insulating layer, e.g. on a main insulation layer, of a power cable. A main insulation layer may be arranged directly on the inner conductor. (A soft semiconductive layer enveloping the inner conductor is considered part of the inner conductor in the context of this disclosure.) In some of these other embodiments, the cable may only need to be stripped down to the insulating layer which may be arranged directly on the inner conductor. In certain other embodiments, the sleeve may be adapted to be arranged on an existing splicing device or termination, provided that the splicing device or the termination are free of an outer shielding layer.

Generally, the sleeve body may comprise the radially innermost layer of the sleeve. A sleeve body may consist of, or comprise, for example, silicone, or EPDM (Ethylene Propylene Diene Monomer), or HEPR (Hard Grade Ethylene Propylene Rubber). The sleeve body may comprise the major geometric volume of the elastic sleeve, e.g. more than 70 percent, more than 80 percent, or more than 90 percent of the geometric volume of the sleeve. Geometric volume may be determined by water displacement.

In a radially expandable sleeve body, before expansion, the receiving space may have an inner diameter that is smaller than the outer diameter of the inner conductor or of the insulating layer of the cable, around which the sleeve is to be arranged. The sleeve body may be expandable by pushing it over the insulating layer or over the inner conductor at an end of the cable. Generally, this push-on technique of arranging an expandable sleeve over an inner conductor or over an insulating layer of a power cable is known. Often, grease is used to facilitate the pushing of an expandable sleeve body over a layer of the cable. Once an expandable sleeve according to this disclosure is pushed over the inner conductor of the cable, the radially innermost layer of the sleeve body may be in direct mechanical contact with the radially outer surface of the inner conductor. Once a different expandable sleeve according to this disclosure is pushed over the insulating layer of the cable, the radially innermost layer of the sleeve body may be in direct mechanical contact with the radially outer surface of the insulating layer.

In a radially shrinkable, or "shrinkable", sleeve body, before shrinking, the receiving space may have an inner diameter that is larger than the outer diameter of the power conductor, around which the sleeve body is to be arranged. The sleeve body may be shrunk by removing a support core that holds the sleeve in a radially expanded state before shrinking.

The sleeve body may consist of a single piece of material or a single element. Alternatively, it may consist of two or more single pieces of material or elements.

An elastic sleeve may comprise two or more sleeve layers. Each of the two or more sleeve layers may be elastic. For example, the sleeve may comprise an inner sleeve layer and an outer sleeve layer. If the sleeve has a tubular or cylindrical shape, the outer sleeve layer may be arranged around the inner sleeve layer and coaxially with the inner sleeve layer.

The word "elastic" is used here to refer generally to elastic deformation of a body. An elastic sleeve is thus a sleeve that can be mechanically deformed and after deformation strives to return almost into its original shape. Shrinkable bodies, e.g. shrinkable sleeves, are examples of elastic sleeves, as they strive to return to their original shape which they had before being expanded. For example, so-called cold-shrink sleeves are radially expanded by a support core when they are manufactured, and radially shrink to their original shape upon removal of the support core. On the other hand, also expandable sleeves, for example so-called push-on sleeves, are examples of elastic sleeves. Their sleeve body has a receiving space with an inner diameter that is slightly smaller than the outer diameter of the power conductor, and when they are pushed onto an end of a cable, they are forced to expand sufficiently to fit around the cable. Due to their elastic nature, they strive to return to their unexpanded shape and thereby exert a radial force that keeps them in tight fit with the outer surface of the cable.

Elastic sleeves according to the present invention can be used for electrically insulating high-voltage or medium-voltage power conductors. Examples of such power conductors are HV/MV power cables or so-called busbars. The power conductor may be a HV/MV power cable or a busbar.

Other examples of such conductors are conductive elements in cable accessories, e.g. in plugs, terminations, or splices. HV/MV power conductors in the context of the present disclosure are conductors that are designed to conduct currents of about 100 Amperes at voltages of at least 3.6 kilovolt. Such power conductors, e.g. power cables, typically require inner conductors having cross sections of at least 0.25 $cm^2$ and insulating components of a thickness of at least 2 mm in order to prevent electrical discharges. This disclosure is expressly not directed to sleeves for cables providing energy to individual machines, computers, household appliances or the like, but to conductors for distributing large amounts of electrical energy in national grids before transformation to outlet voltages.

A receiving space in the sleeve body of an elastic sleeve according to the present invention is a space, comprised or formed in the sleeve body, that is adapted to receive a section of the power conductor such that the sleeve body surrounds the power conductor. The receiving space may consist of, or comprise, a through-hole or bore. The through-hole or bore may be cylindrical.

A receiving space of an elastic sleeve according to the present invention is a space, comprised and/or formed in the sleeve body, that may be delimited by a receiving space wall. The receiving space may be formed by an elastic portion of the sleeve. The receiving space and/or the receiving space wall may thus be elastic.

The receiving space may be deformable. It may be deformable such as to adapt to the outer surface of the power conductor when the sleeve body is radially shrunk around the power conductor or radially expanded when the sleeve is pushed over the power conductor.

A cavity of an elastic sleeve according to the present invention is a space, comprised and/or formed in the sleeve body, that is delimited by a cavity wall. The cavity wall may be formed by an elastic portion of the sleeve body. The cavity wall may thus be elastic. This may allow the cavity to change its shape when the sleeve is shrunk or expanded.

A cavity in an elastic sleeve according to the present invention may be a space, comprised in the sleeve body, that is adapted to receive the divider assembly such that the sleeve body surrounds the divider assembly, e.g. surrounds the divider assembly such that the divider assembly is arranged, at least partially, in the cavity. The divider assembly may be arranged completely in the cavity. Alternatively, the divider assembly may be arranged partially in the cavity, in other words, a portion of the divider assembly may be arranged in the cavity.

The cavity may consist of, or comprise, a through-hole or a blind hole in the sleeve. The through-hole or the blind hole may have, for example, a circular, an elliptical, an oval, a rectangular, a triangular or an irregular cross section. The cross section of the cavity may be shaped such as to correspond to a cross section of the divider assembly. This may minimize the space between the divider assembly and the cavity wall.

The cavity may be shaped and arranged such that it surrounds the receiving space. In other words, the cavity may extend circumferentially around the receiving space. This may allow for the divider assembly to be arranged circumferentially around the receiving space. This may be a space saving arrangement of the divider assembly and may in turn allow the elastic sleeve to be shorter.

The cavity wall may be deformable. It may be deformable such as to adapt to the outer surface of the divider assembly when the sleeve body is radially shrunk around the power conductor or radially expanded when the sleeve is pushed over the power conductor.

The cavity wall may be deformable when the sleeve body is shrunk or expanded. The risk of the cavity wall breaking or being damaged by the shrinking or expansion is thereby reduced.

The cavity wall may be electrically insulating. This may reduce the risk of electrical discharge or electrical shorts between discrete impedance elements.

The divider assembly according to the present invention comprises a plurality of (e.g. two, three or more) discrete impedance elements of which at least two of said impedance elements are electrically connected in series such as to be operable as a voltage divider for sensing a voltage of an inner conductor of the power conductor. At least two discrete impedance element in the plurality of discrete impedance elements may be mechanically connected in series, e.g. such as to form a chain. The voltage divider may be electrically connected between an inner conductor of the power conductor and low voltage or electrical ground. An impedance element may be, for example, a resistor, a capacitance or an inductance. A plurality of discrete impedance elements may comprise one resistor and one or more capacitors. A plurality of discrete impedance elements may comprise one resistor and one or more inductances. A plurality of discrete impedance elements may comprise one inductance and one or more capacitors. Generally, the plurality of discrete impedance elements may comprise one or more resistors, and/or one or more capacitors and/or one or more inductances. Resistors, capacitors and inductances are particularly suitable elements to form a voltage divider, because they are readily available at moderate cost. Also, their electrical properties are generally precisely specified.

In one aspect of the present disclosure, the plurality of discrete impedance elements comprises a plurality of capacitors. A respective resistor may be electrically connected in parallel to at least one of the plurality of capacitors. A plurality of respective resistors may be electrically connected in parallel to two or more of the plurality of capacitors. A respective resistor may be electrically connected in parallel to each of the plurality of capacitors, so that each capacitor has a resistor connected parallel to it. The plurality of capacitors may be operable as the voltage divider or as elements of the voltage divider for sensing the voltage of the inner conductor. The arrangement of a respective resistor in parallel to at least one of the capacitors can reduce the influence of the cross section of the inner conductor on parasitic capacitance at a given frequency, e.g. at 50 Hertz or 60 Hertz: With a larger cross section, the outer surface of the inner conductor is normally larger than with a smaller cross section, which generally increases the parasitic capacitances against high voltage in the power conductor and thereby reduces the accuracy of the voltage sensing.

The reduced dependence on the cross section of the inner conductor is believed to result from the currents through the capacitive part of the voltage divider are phase-shifted by 90° relative to the current through the resistor(s). Currents through the parasitic capacitances are not phase-shifted relative to the currents through the capacitances of the voltage divider. This does almost not impact the current amplitude through the resistors, except for a small phase shift. Since the current through the resistor(s) is the main current through the divider, due to the low-impedance of the resistor(s), the output voltage does not change much.

The electrical effect of such parallel resistors may even make the need for electric shielding of the voltage divider obsolete. This may reduce manufacturing cost of a sleeve according to the present disclosure.

Where one or more such parallel resistors are used, it appears advantageous to keep the total capacitance of the capacitors low, thereby providing a high impedance, and to keep the total resistivity of the resistor(s) low for a low overall resistive impedance, presuming a balanced configuration of components.

In a specific embodiment, the divider assembly may comprise twenty capacitors, electrically connected in series such as to be operable as a voltage divider for sensing the voltage of the inner conductor. Each of the twenty capacitors has a respective resistor electrically connected parallel to it. Generally, and independent of this embodiment, the resistors can be arranged adjacent to the capacitors. For capacitors arranged on top of a PCB, the resistors can be arranged geometrically on top of the respective capacitors, so that each capacitor is located between the PCB and the respective resistor.

The resistances of the individual resistors arranged parallel to capacitors may be identical. Alternatively the resistances of an individual resistor may be different from the resistances of one other resistor, of two or more other resistors, or of all other resistors of those resistors electrically connected in parallel to the capacitors. For a high-voltage inner conductor at 20 kilovolt and a voltage divider having twenty serially connected capacitors having capacitances of about 1000 pico Farad (pF), the resistors may have typical resistances of between about 2.5 MΩ and about 12.5 MΩ, resulting in an overall resistance of between 50 MΩ and 250 MΩ.

A divider assembly suitable for forming a voltage divider in a sleeve according to the present disclosure can comprise two or more discrete impedance elements, for example it can comprise 2, 3, 4, 5, 10, 20, 30, 50, 100, 150, or even 200 or more discrete impedance elements.

The divider assembly may be rigid. This may facilitate pushing the divider assembly into the cavity. Alternatively the divider assembly may be flexible, e.g. bendable. A flexible divider assembly may be able to follow any deformations of the sleeve body of the elastic sleeve, e.g. when the sleeve body is shrunk or expanded or bent.

The divider assembly may comprise a printed circuit board ("PCB") on which the plurality of discrete impedance elements is arranged. The PCB may be flexible or rigid.

At least two discrete impedance element in the plurality of discrete impedance elements are connected in series such as to be operable as a voltage divider. They may be electrically connected by wires or by conductive traces on a PCB or by soldering material. Each impedance element may comprise two contacts for connecting it electrically.

A first impedance element of the plurality of discrete impedance elements may have a high-voltage contact for electrical connection to a component of the power conductor on high-voltage, e.g. to the inner conductor. The high-voltage contact may be arranged in the cavity. Generally, the high-voltage contact may be arranged such as to be in electrical contact with the inner conductor of the power conductor when the sleeve body is shrunk around, or expanded over, the power conductor. Where the divider assembly has an elongated shape comprising a first end portion and an opposed second end portion, the high-voltage contact may be arranged at the first end portion of the divider assembly.

A second impedance element of the plurality of discrete impedance elements may have a low-voltage contact for electrical connection to low voltage or to electrical ground. The low-voltage contact may be arranged in the cavity or outside the cavity. Generally, the low-voltage contact may be arranged such as to be accessible for electrical contacting from outside the sleeve body. Where the divider assembly has an elongated shape comprising a first end portion and an opposed second end portion, and where the high-voltage contact is arranged at the first end portion, the low-voltage contact may be arranged at the second end portion of the divider assembly. A ground wire may be electrically connected to the low-voltage contact for making the voltage of the low-voltage contact available outside of the cavity.

The divider assembly may comprise a midpoint access contact for picking up a divided voltage from the plurality of discrete impedance elements. The midpoint access contact may be electrically arranged between the first and the second impedance element. A signal wire may be electrically connected to the midpoint access contact for making the voltage of the midpoint access contact available outside of the cavity.

The plurality of discrete impedance elements connected in series may be arranged in a straight chain. Since the voltage along the plurality of impedance elements generally drops from the high-voltage contact to the low-voltage contact, a linear chain geometry provides for a maximum distance between two discrete impedance elements that are on different voltages and thereby reduces the risk of electrical discharges between impedance elements or between conductive wires or traces connecting the impedance elements with their respective neighbours. If the cavity has a cylindrical shape, the straight chain may be oriented parallel to the rotational symmetry axis of the cylindrical shape of the cavity. Independent of the shape of the cavity, if the receiving space has a rotationally symmetric shape, the straight chain may be oriented parallel to the rotational symmetry axis of the cylindrical shape of the receiving space.

Alternatively, the plurality of discrete impedance elements may be arranged in a Z-shaped chain or, generally, in a folded chain. Such a geometrical arrangement may provide for a compact construction of the divider assembly. Under some circumstances, this geometry may keep the extension of the divider assembly short, e.g. in a direction parallel to a long extension of the receiving space or in an along-cable direction, so that the elastic sleeve can be shorter. One end, e.g. the end in the vicinity of the first impedance element, i.e. the high-voltage end, of the Z-shaped or folded chain may be arranged in the vicinity of the receiving space. This may allow that one of the discrete impedance elements, e.g. the first impedance element, can be mechanically connected to the power conductor. The opposed end, e.g. the end in the vicinity of the second impedance element, i.e. the low-voltage end, of the Z-shaped or folded chain may be arranged in the vicinity of a radially outer surface of the sleeve body. This may facilitate mechanical connection of a discrete impedance element located on that opposed end to electrical ground.

Alternatively, the plurality of discrete impedance elements may be arranged in a linear chain on a flexible PCB, which PCB may be wound upon itself in a spiralling geometry. The wound-up PCB may be arranged in the cavity of the elastic sleeve coaxially around the receiving space. Such a geometrical arrangement may provide for a compact construction of the divider assembly. Such a geometrical arrangement may be particularly advantageous in that it requires very little space in a direction along the receiving space, i.e. in a direction along the power conductor.

The outer shape of the divider assembly is generally independent of the shape formed by the arrangement of the discrete impedance elements.

The plurality of discrete impedance elements may be arranged on a flexible printed circuit board. This may facilitate deformation and bending of the divider assembly as the sleeve is deformed or bent, with less risk of the divider assembly being damaged by the deformation or bending. In particular, arrangement on a flexible circuit board may reduce the risk of damage and failure when the elastic sleeve is shrunk or expanded.

Alternatively, the plurality of discrete impedance elements may be arranged on a rigid printed circuit board. This may be advantageous in that the divider assembly may have a greater mechanical stiffness, which in allows to push the divider assembly into the cavity more easily and with less risk of damage when assembling an elastic sleeve according to the present disclosure.

A flexible printed circuit board carrying the plurality of discrete impedance elements may be arranged in a spiral shape around the receiving space.

As a further alternative, the plurality of discrete impedance elements may be unsupported, or free-hanging, i.e. not be arranged on a PCB. Such divider assemblies may be very cost-effective to manufacture as no support structure is required. They may also be particularly space-saving, because no space for a PCB needs to be provided.

The divider assembly may comprise an encapsulation body in which the plurality of discrete impedance elements may be encapsulated or embedded. Encapsulating the impedance elements in an encapsulation body may provide additional electrical insulation of the impedance elements against each other and against the remainder of the sleeve. The encapsulation body may also provide additional protection of the impedance elements against mechanical impacts like abrasion or chemical or environmental impacts. The encapsulation body may be solid. A solid encapsulation body may provide for a higher stiffness of the divider assembly and facilitate insertion of the divider assembly into the cavity. The encapsulation body may comprise a smooth outer surface. Such a smooth outer surface may reduce the number and size of voids between the divider assembly and the inner wall of the cavity, when the divider assembly is arranged in the cavity.

The encapsulation body may consist of a resin. The resin may be a hardened resin. The resin may be transparent. This may facilitate visual inspection of the impedance elements, when the divider assembly is removed from the cavity.

The divider assembly may be removable from the cavity. The divider assembly or the cavity or both may be adapted to facilitate removal, e.g. manual removal, of the divider assembly from the cavity. A removable divider assembly may allow to check or monitor the divider assembly and the cavity.

The elastic sleeve may comprise a high-voltage contact for electrical connection, e.g. ohmic connection, of a first discrete impedance element of the plurality of discrete impedance elements to an inner conductor of the power conductor. Such a high-voltage contact facilitates connection of the voltage divider assembly to a high voltage, which is present in the inner conductor of the power conductor when in use. The contact may, for example, be a spring contact.

Where the power conductor is a power cable, the high-voltage contact of the elastic sleeve according to the present disclosure may be electrically connectable to a cable lug arranged on an end portion of the inner conductor of the power cable. This electrical connection between the high-voltage contact and the lug may be affected via a high-voltage (HV) wire. At one end, the HV wire may be mechanically and electrically connected to the high-voltage contact. This electrical connection may be by, for example, soldering or welding.

At its other end, the HV wire may be electrically connectable to a conductive outer circumference of the cable lug, arranged on an end portion of the inner conductor of the cable, via an electrically conductive resilient clamp, extending around at least half the outer circumference of the lug, and adapted to press the HV wire against the outer surface of the lug.

Alternatively, at its other end, the HV wire may be electrically connectable to a conductive inner surface of the cable lug by arranging this other end of the HV wire on an outer surface of an exposed end portion of the inner conductor, by inserting this other end of the HV wire and the exposed end portion of the inner conductor together into the cable lug and by subsequently crimping the cable lug around the other end of the HV wire and the exposed end portion of the inner conductor, whereby the end of the HV wire is secured in electrical contact with the cable lug and with the exposed end portion of the inner conductor.

Electrical contact between the other end of the HV wire and the exposed end portion of the inner conductor may be enhanced by attaching the end of the HV wire to a flexible conductive metal mesh, e.g. by soldering or welding, wrapping the mesh around the exposed end portion of the inner conductor, inserting the mesh, the end of the HV wire and the exposed end portion of the inner conductor together into the cable lug and by subsequently crimping the cable lug around the mesh, the other end of the HV wire and the exposed end portion of the inner conductor, whereby the mesh and the end of the HV wire are secured in electrical contact with the cable lug and with the exposed end portion of the inner conductor.

Independent of the presence of a high-voltage contact, the elastic sleeve may comprise a low-voltage contact for electrical connection of a second discrete impedance element of the plurality of discrete impedance elements to electrical ground. A low-voltage contact may facilitate connection of the voltage divider assembly to a lower voltage or to electrical ground. The low-voltage contact may be freely accessible from outside the cavity. It may be freely accessible from outside the sleeve body or the elastic sleeve. An example of a low-voltage contact is an end of a wire, leading from inside the cavity to outside, of which the other end is soldered to the second discrete impedance element.

An elastic sleeve according to the present disclosure may comprise a high voltage contact, a low-voltage contact, or both.

The cavity may have an elongated shape and may extend longitudinally in a first direction. The receiving space may have an elongated shape and may extend longitudinally in a second direction. The first direction may be parallel to the second direction within an angle of +/−10°. This parallel arrangement may allow for a particular space saving arrangement of the cavity in the sleeve. The resulting elastic sleeve may therefore be smaller, which allows its installation in places where space is scarce, and may also make its production more cost-effective, because less material may be required to manufacture the sleeve.

The elastic sleeve according to the present disclosure may further comprise an electrically insulating voidfilling material, arranged in the cavity. The voidfilling material may be arranged between at least a portion of the divider assembly and at least a portion of the cavity wall such as to fill a space between the divider assembly and the cavity wall.

Such a voidfilling material may be advantageous because its presence in the cavity may reduce the risk of discharges between the cavity wall and the divider assembly, in particular between the cavity wall and one of the discrete impedance elements. Such risk exists, because the cavity wall is typically on a low electrical potential, while the divider assembly or parts of it are on high potential, i.e. on high voltage. If the space between a part of the divider assembly and a part of the cavity wall is filled with air, the resistance to discharges between that part of the divider assembly and that part of the cavity wall may not be high enough to prevent a discharge. By filling that space with the electrically insulating voidfilling material, the risk of discharge may be reduced.

The divider assembly may have an irregular outer shape, e.g. with protrusions formed by discrete impedance elements. Also the cavity wall may have an irregular shape, e.g. with ridges and recesses. Suitable voidfilling material fill the space between the divider assembly and the cavity to a large percentage, thereby reducing the number and/or size of any remaining air voids in the space between the divider assembly and the cavity wall. Many voidfilling materials may not fill all voids in the space between the divider assembly and the cavity wall completely. However, also these voidfilling materials are considered suitable for the purpose, because they reduce the risk of discharges, albeit not to zero.

Before use, the body of an elastic sleeve according to the present invention is normally shrunk down around the power conductor, or is radially expanded when being pushed over the power conductor. Both this shrinkage and this expansion can be termed "elastic deformation" of the sleeve or the sleeve body. It is desirable that the voidfilling material reduces air voids between the divider assembly and the cavity wall after the cavity wall after the sleeve body is shrunk down or radially expanded. Hence it is preferable that the voidfilling material fills a space between the divider assembly and the cavity wall after the sleeve body is shrunk down or radially expanded. However, it may be desirable that the voidfilling material fills a space between the divider assembly and the cavity wall also before the sleeve body is shrunk down or radially expanded. This latter property may, under specific circumstances, allow for testing of the sleeve before it is applied on a power conductor.

Suitable voidfilling materials may be, for example, flexible resins for use in re-enterable closures or electrically insulating lubricants.

The volume and shape of the cavity may change as the sleeve body is shrunk or expanded. A voidfilling material may thus be deformable, i.e. mechanically deformable. It may in particular be deformable at temperatures between −50° C. and 100° C., more preferably between −20° C. and +70° C. The voidfilling material may be elastically deformable. The voidfilling material being deformable may allow the voidfilling material to change its shape as the cavity changes its shape. This, in turn, may facilitate the voidfilling material to fill space between divider assembly and cavity wall, e.g. air voids, after the sleeve is shrunk or expanded. The risk of electric discharges is thereby reduced.

Preferably, a voidfilling material is soft or flowable or both. This may facilitate filling small voids that would otherwise be filled with air. Preferably, a voidfilling material is soft or flowable or both at 20° C. or at temperatures between 0° C. and 100° C.

The voidfilling material may consist of a mastic or of a gel, in particular a silicone gel. More generally, the voidfilling material may comprise a mastic or a gel, in particular a silicone gel. Mastic, gels and in particular silicone gels are particularly suitable insulating materials because they are readily deformable in wide temperature ranges and provide suitable electrical insulation properties. Other suitable voidfilling materials are, for example, silicone materials curing at room temperature or silicone-free grease.

Independent of its other properties, the voidfilling material may be an adhesive. It may have adhesive properties. A voidfilling material may be adapted for adhering to the divider assembly or to the cavity wall or to both. An adhesive voidfilling material may stick to the cavity wall and/or to the divider assembly as the sleeve is shrunk or expanded, which may result in filling more voids or filling voids to a greater extent after the sleeve is applied to the power conductor by shrinking or expanding it.

Independent of its other properties, the voidfilling material may have a dynamic viscosity of less than 6000 mPa·s at 23° C., as measured according to the ISO 3219 method. It may have a dynamic viscosity of between 100 and 10000 mPa·s at 23° C., as measured according to the ISO 3219 method.

The inventors of the present application have found that a voidfilling material having such a viscosity is particularly well suited to fill voids in the cavity at temperatures normally used when applying sleeves to power conductors like MV/HV cables.

Elastic sleeves as described herein may be used advantageously for electrically insulating high-voltage (HV) cables or medium-voltage (MV) cables, or other power conductors, in power networks for distributing electrical power over large areas, such as in national grids. The present disclosure therefore also provides a power network comprising a high-voltage/medium voltage (HV/MV) power conductor insulated by an elastic sleeve as described herein.

The invention also provides a kit of parts for being assembled to form an elastic sleeve as described above, comprising a) an elastic sleeve body for electrically insulating a HV/MV power conductor in a power network, the sleeve body being radially shrinkable around the power conductor or radially expandable when pushed over the power conductor, the sleeve body comprising a receiving space for receiving a section of the power conductor such that the sleeve body surrounds the power conductor;

a cavity formed in the sleeve body and delimited by a cavity wall formed by a portion of the sleeve body;

b) a divider assembly comprising a plurality of discrete impedance elements of which at least two of said impedance elements are electrically connected in series such as to be operable as a voltage divider for sensing a voltage of the power conductor, wherein the divider assembly is arrangeable in the cavity.

Such a kit can be assembled in at least two ways in order to form a sleeve as described above: In a first process, the divider assembly can be inserted into the cavity before the sleeve, i.e. the sleeve body, is shrunk down, or expanded, over the power conductor. In an alternative second process, the sleeve may be shrunk down, or expanded over, the power conductor while the divider assembly is outside the cavity, and the divider assembly is inserted into the cavity after shrinkage or expansion, i.e. when the sleeve body has reached its final shape. An advantage of the second process is that the divider assembly is not exposed to any forces generated by deforming the sleeve body.

Insertion may be easier and more reliable if the divider assembly has a smooth surface. Independent of the surface of the divider assembly, a friction-reducing material, e.g. a grease, may be used to reduce friction between the divider assembly and the cavity wall upon insertion.

Generally, in order to achieve a tight fit between an encapsulated divider assembly and the cavity wall, the outer shape of the divider assembly may be shaped such as to correspond to the inner shape of the cavity. Alternatively, a cross section of the divider assembly may be shaped such as to correspond to a cross section of the cavity.

If the outer shape of the divider assembly corresponds to the inner shape of the cavity, a diameter of the divider assembly may be selected such as to be larger than a diameter of the cavity by an amount that causes the cavity wall to exert a pressure on the divider assembly, while still allowing manual insertion of the divider assembly into the cavity. The pressure may be sufficient to cause friction for holding the divider assembly in the cavity.

Also if the divider assembly is inserted into the cavity after expansion/shrinkage of the sleeve body, it may be advantageous if a voidfilling material is arranged in the cavity. Voidfilling material may be arranged in the cavity before inserting the divider assembly into the cavity.

Certain voidfilling materials may be suitable to act as a friction-reducing material. An example of such a material may be an electrically insulating grease.

The divider assembly may be adapted to be removable from the cavity. The divider assembly or the cavity or both may be adapted to facilitate removal, e.g. manual removal, of the divider assembly from the cavity. A removable divider assembly may allow to check the divider assembly and the cavity.

The divider assembly or the cavity or both may be adapted to facilitate insertion, e.g. manual insertion, of the divider assembly into the cavity. The divider assembly or the cavity or both may be adapted to facilitate insertion, e.g. manual insertion, of the divider assembly into the cavity after expanding or shrinking the sleeve over a power conductor. The possibility of inserting a divider assembly into the cavity may allow to replace a divider assembly by a new divider assembly after a failure. This may make it obsolete to replace the sleeve body or the entire sleeve.

In a kit, the divider assembly may initially not be assembled, but the discrete impedance elements may be available to be assembled later to form the divider assembly. Such a kit may provide for greater flexibility in terms of where and when to assembly the elastic sleeve. Therefore, the invention also provides a kit of parts for being assembled to form an elastic sleeve as described above, comprising a) an elastic sleeve body for electrically insulating a HV/MV power conductor in a power network, the sleeve body being radially shrinkable around the power conductor or radially expandable when pushed over the power conductor, the sleeve body comprising
  a receiving space for receiving a section of the power conductor such that the sleeve body surrounds the power conductor;
  a cavity formed in the sleeve body and delimited by a cavity wall formed by a portion of the sleeve body;
b) a plurality of discrete impedance elements of which at least two of said impedance elements can be electrically connected in series such as to form a divider assembly operable as a voltage divider for sensing a voltage of the power conductor, wherein the divider assembly is arrangeable in the cavity.

Any of the kits of parts described above may further comprise c) an electrically insulating voidfilling material, adapted for being arranged in the cavity such that the voidfilling material is arranged between at least a portion of the divider assembly and at least a portion of the cavity wall such as to fill a space between the divider assembly and the cavity wall.

The described kits of parts can be easily assembled to form an elastic sleeve as described above, with all its advantages mentioned.

The invention also provides a method of applying an elastic sleeve on a MV/HV power conductor, e.g. on a MV/HV cable, the method comprising the following steps, in any sequence:

a) providing a kit of parts as described above, and providing a MV/HV power conductor;

b) arranging a section of the power conductor in the receiving space of the sleeve body;

c) arranging the divider assembly in the cavity of the sleeve body.

The invention further provides an elbow plug or a cable splicing device for use with a MV/HV cable, comprising an elastic sleeve as described above. Such elbow plugs or cable splicing devices provide, further to their traditional function of connecting and protecting a cable end, an element that can be used to sense the voltage of the cable inner conductor, namely the divider assembly in the elbow plug or splicing device.

Figure 2:
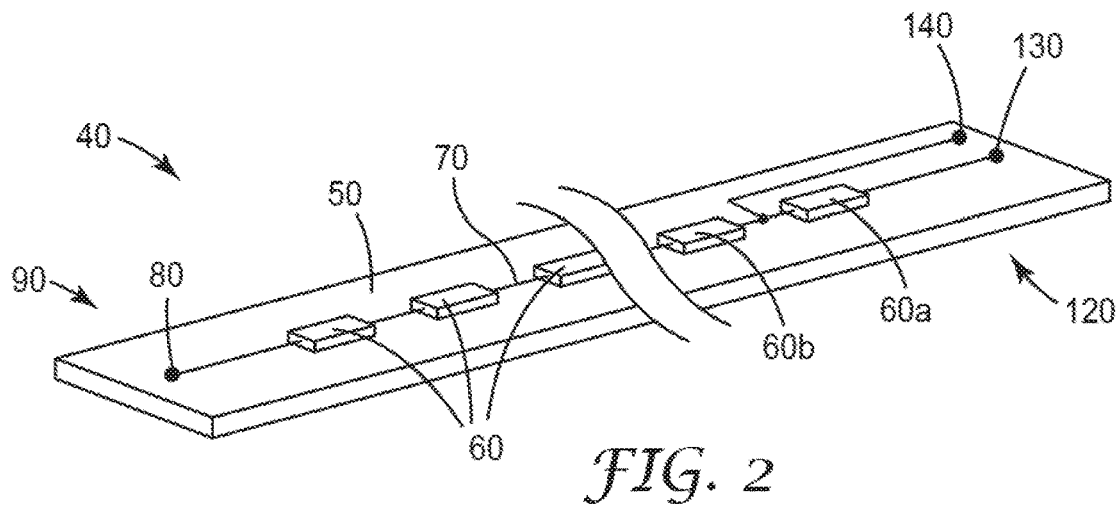
Figure 3:
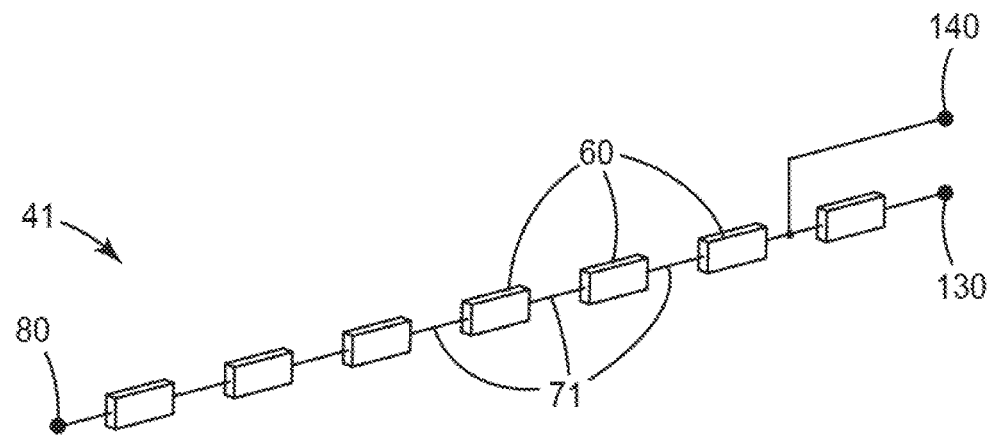
Figure 4:
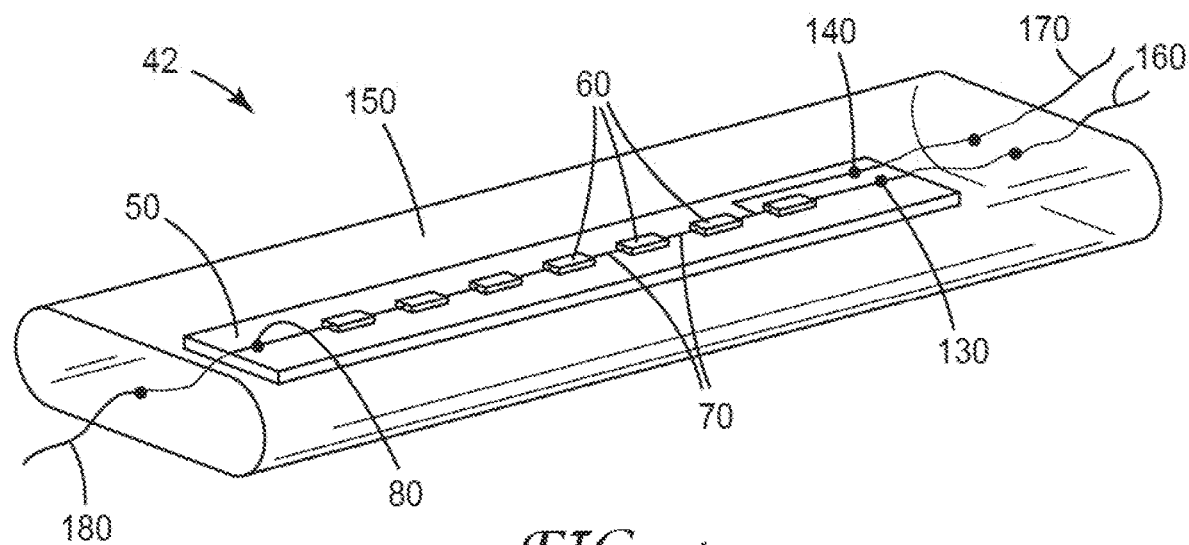
Figure 5:
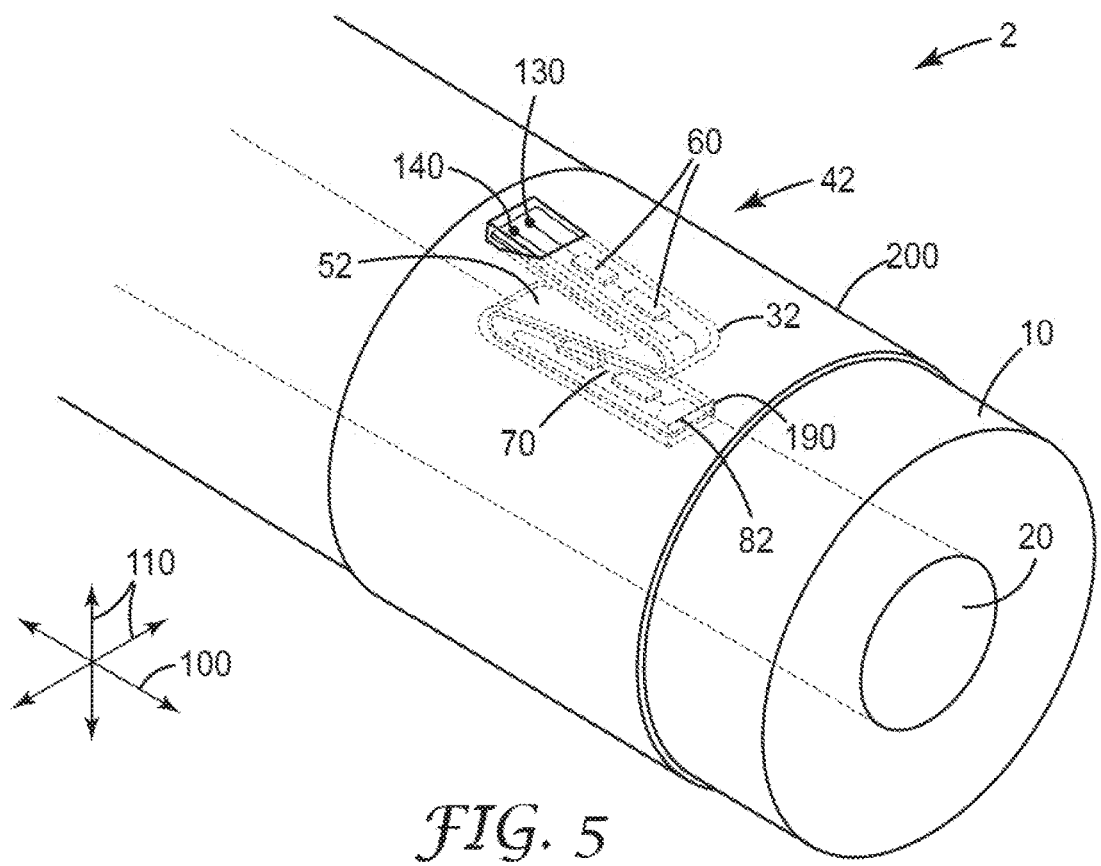
Figure 6:
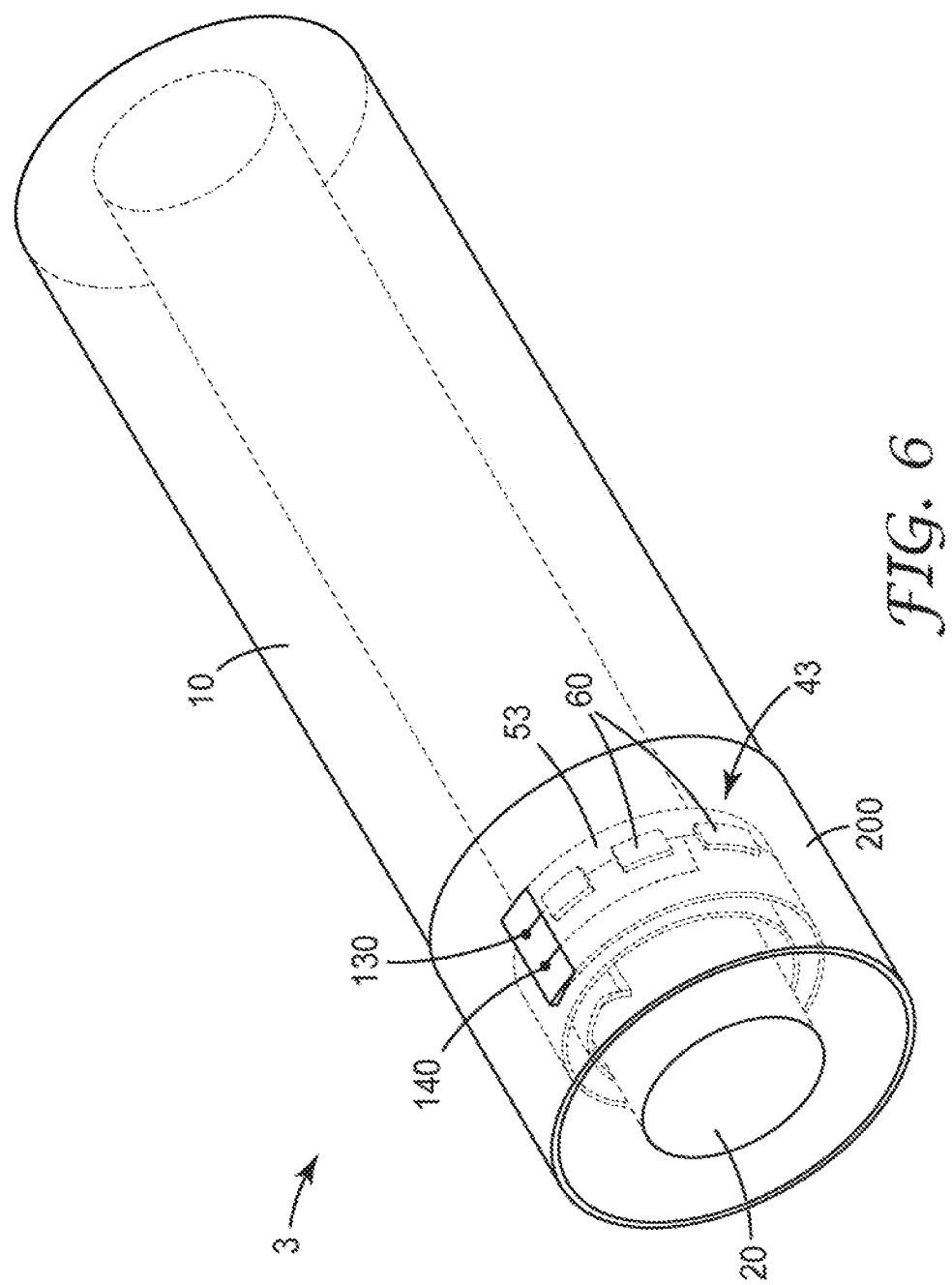
Figure 7:
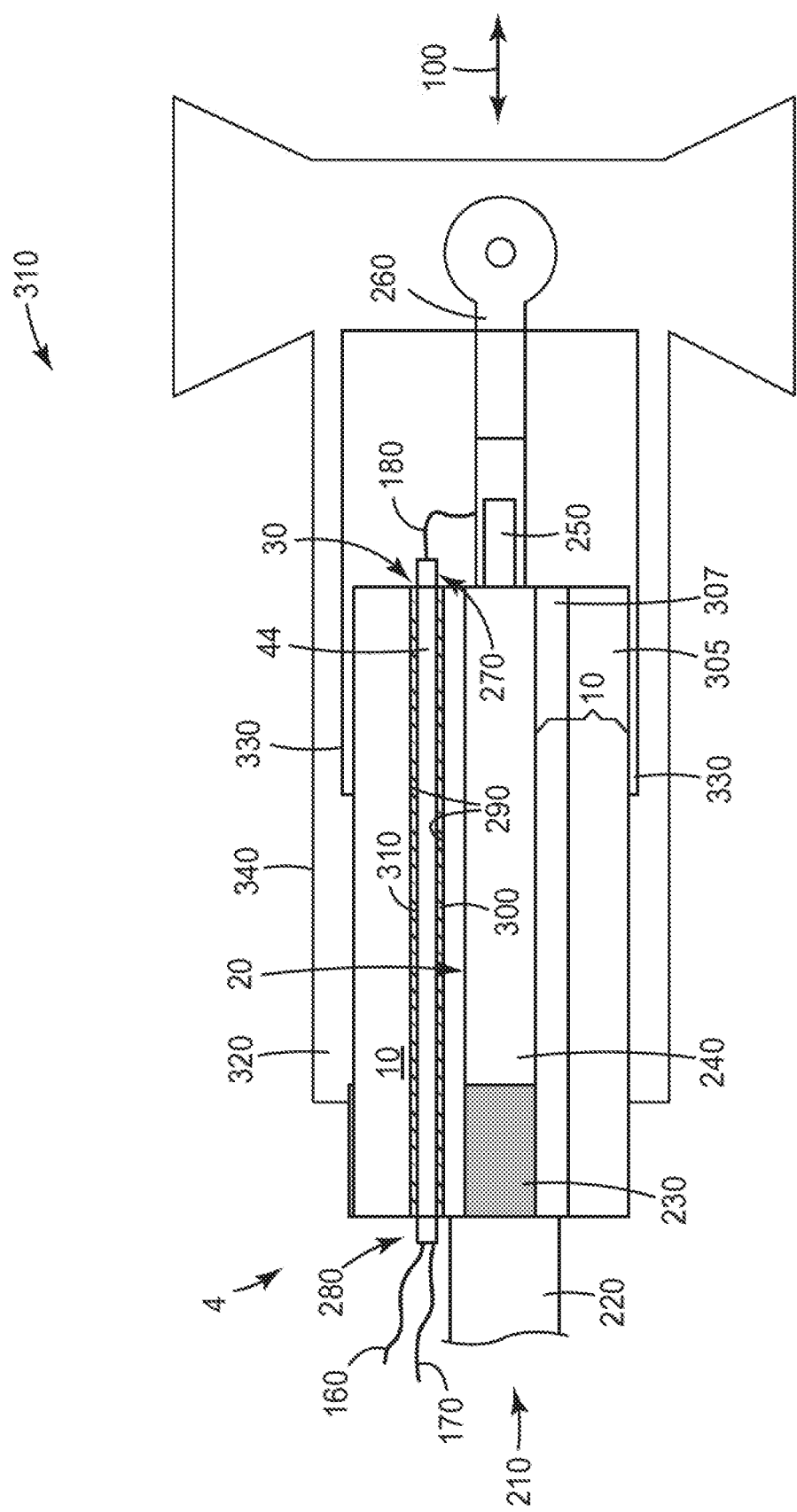

The invention will now be described in more detail with reference to the following Figures exemplifying particular embodiments of the invention:

FIG. 1 Perspective sketch of a first, expandable sleeve according to the invention;

FIG. 2 Perspective sketch of a first divider assembly, usable in elastic sleeves according of the invention;

FIG. 3 Perspective sketch of a second divider assembly, also usable in elastic sleeves according of the invention;

FIG. 4 Perspective sketch of a third, encapsulated divider assembly, usable in elastic sleeves according of the invention;

FIG. 5 Perspective sectional sketch of a second elastic sleeve according to the invention;

FIG. 6 Perspective sketch of a third elastic sleeve according to the invention; and FIG. 7 Longitudinal sectional view of an elbow plug comprising a fourth, shrinkable sleeve according to the invention, applied on a cable end.

FIG. 1 shows, in perspective view, a first elastic sleeve 1 according to the invention. The sleeve 1 has a tubular sleeve body 10 of electrically insulating silicone material. The sleeve body 10 forms a receiving space 20 for receiving a stripped power cable. The receiving space 20 is a central through-hole, it has an elongated cylinder shape and a circular cross section. The symmetry axis of the cylinder defines axial directions, indicated by an arrow 100, while radial directions 110 are directions orthogonal to the axial directions 100.

The sleeve body 10 also forms an elongated cavity 30, extending longitudinally through the sleeve body 10. The cavity 30 has an elongated shape and an elliptic cross section. Its longitudinal extension is oriented parallel to the symmetry axis and to the longitudinal extension of the receiving space 20. The sleeve body 10 forms a wall, a cavity wall, which delimits the cavity 30.

A divider assembly 40 is arranged in the cavity 30. It extends through the full length of the cavity 30 and a short distance beyond, so that end portions of the divider assembly 40 protrude from the cavity 30. The divider assembly 40 comprises a number of discrete resistors (not visible in FIG. 1), which will be explained in the context of FIGS. 2, 3 and 4. These resistors can be operated as a voltage divider for sensing a voltage of the inner conductor of a power cable, with which the sleeve 1 is to be used.

The elastic sleeve 1 is radially expandable, so that it can be pushed over an end portion of a MV/HV power cable. The sleeve 1 is pushed on the power cable in an axial direction 100, so that the receiving space 20 accommodates a section of the power cable. Typically, the power cable is stripped down, i.e. some of its outer layers are removed, such that the outermost layer is the main insulation layer of the cable. The inner diameter of the receiving space 20 is chosen such that it is slightly smaller than the outer diameter of the stripped cable. The sleeve 1 is then forced over the cable in an axial direction 100, whereby the inner diameter of the receiving space 20 increases and the sleeve 1 expands in radial directions 110. This method to arrange the sleeve 1 on the end of a power cable is generally termed "push-on method". The sleeve 1 is elastic, so that after expansion it strives to return to its original, non-expanded shape (except for a small amount of permanent deformation, called "permanent set"), whereby it exerts a radial force on the cable, which results in friction between the sleeve 1 and the cable. This friction prevents the sleeve 1 from moving relative to the cable.

The divider assembly 40 in this first sleeve 1 comprises a rigid printed circuit board ("PCB"), on which the discrete resistors are mounted. The rigidity of the PCB facilitates pushing the divider assembly 40 into the cavity 30 from one end of the cavity 30.

The cross section of the cavity 30 is chosen such that the divider assembly 40 fits into the cavity 30 with only very little space remaining between the divider assembly and the cavity wall, before the sleeve 1 is pushed onto the cable. If necessary, grease can be used to facilitate pushing the divider assembly 40 into the cavity 30.

When the sleeve 1 is pushed on the cable end, the sleeve 1 is expanded and the cavity 30 has a different, smaller cross section. After sleeve expansion, there is a tight fit between the divider assembly 40 and the inner wall of the cavity 30. The tight fit after expansion provides that only small air-filled pockets or voids exist between the outer surface of the divider assembly 40 and the inner wall of the cavity 30. Depending on the operating voltage of the central inner conductor of the power cable, these voids may be small enough to not allow discharges between the divider assembly 40 and the inner wall of the cavity 30.

FIG. 2 is a perspective sketch of the divider assembly 40 of the sleeve 1 shown in FIG. 1, showing more details. The divider assembly 40 comprises a rigid PCB 50, on which a plurality of discrete resistors 60 are mounted. The resistors 60 are electrically connected in series by conductive traces 70 on the PCB 50, so that they can be operated as a voltage divider. The resistors 60 form a straight chain.

Close to a left-hand first end portion 90 of the divider assembly 40, the leftmost resistor 60 in FIG. 1 is connected to a high-voltage contact 80, which facilitates electrical connection of the chain of resistors 60 to the high voltage of the inner conductor of the cable. Similarly, close to the opposed second end portion 120, on the right side in FIG. 1, the rightmost resistor 60a is connected to a low-voltage contact 130, which facilitates electrical connection of the chain of resistors 60 to low voltage, e.g. to electrical ground.

At its second end portion 120, the divider assembly 40 has a midpoint access contact 140 for picking up a divided voltage from the voltage divider formed by the plurality of resistors 60. The midpoint access contact 140 is electrically connected between the rightmost resistor 60a and the resistor 60b adjacent to the rightmost resistor 60a. If the high-voltage contact 80 is electrically connected to the inner conductor of the cable, and the low-voltage contact 130 is connected to ground, the voltage at the midpoint access contact 140 changes proportionally to the high voltage. The proportionality factor depends on the divider ratio of the voltage divider, i.e. on the total resistance on one side of the midpoint access contact 140 versus the resistance of the rightmost resistor 60a. By suitably choosing the resistances of the individual resistors 60 and of the rightmost resistor 60a on the other side of the midpoint access contact 140, the divider ratio can be adjusted for the voltage divider to yield a suitable output voltage at the midpoint access contact 140.

Wires can be connected to the high-voltage contact 80, to the low-voltage contact 130 and to the midpoint access contact 140 by which the respective voltages can be made accessible outside the cavity 30 of the sleeve 1.

Instead of using resistors 60, alternative voltage dividers can be made of capacitors or of inductances, electrically connected in series, or even mixtures of such elements. The actual choice will depend on the requirements, e.g. a required frequency stability of the divider ratio. The term "impedance element" is used in this disclosure as a general term for capacitors, resistors and inductances.

The impedance elements of a voltage divider do not necessarily have to be mounted on a PCB. FIG. 3 shows, in a perspective sketch, an alternative, second divider assembly 41, comprising a chain of resistors 60 connected in series. These resistors 60 are not mounted on a PCB, but are just mechanically and electrically connected to each other via flexible wires 71. This alternative divider assembly 41 comprises a high-voltage contact 80 at one end of the chain, a low-voltage contact 130 at the opposed end of the chain, and a midpoint access contact 140 connected between two resistors 60 of the chain.

This alternative divider assembly 41 is not rigid enough for pushing it into the cavity 30, but it can be arranged in the cavity 30 of the sleeve 1 e.g. by pulling it into the cavity 30. The flexible wires 71 provide flexibility to the divider assembly 41.

FIG. 4 shows, in a perspective view, a third divider assembly 42. It is similar to the first divider assembly 40 shown in FIG. 2, except that the PCB 50 and the resistors 60 mounted on it are encapsulated in a solid encapsulation body 150 which is made of a hardened resin. The PCB 50 with the resistors 60 and the conductive traces 70 on it is submerged in the resin while the resin is liquid. The resin is then allowed to solidify and harden, so that it forms the solid encapsulation body 150. For clarity, the encapsulation body 150 is shown transparent in FIG. 4, but the encapsulation body 150 may actually be transparent, translucent, or opaque. The resin is a thermosetting material comprising Polyurethane. Alternatively, it is contemplated to use other resins like, for example, epoxy-based thermosetting materials or thermoplastic materials comprising Polyethylene or Polypropylene.

Advantageously, wires or other conductors are electrically connected to the chain of resistors 60 and led to outside the encapsulation body 150, so that the resistors 60 can be electrically contacted outside of the encapsulation body 150 in order for them to be operable as a voltage divider. In the divider assembly 42 shown in FIG. 4, a ground wire 160 is connected to the low-voltage contact 130, a signal wire 170 is connected to the midpoint access contact 140, and a high-voltage wire 180 is connected to the high-voltage contact 80. The high-voltage wire 180 is for ohmic connection to the inner conductor of a power cable.

It is apparent that also the chain of resistors 60 of the second divider assembly 41 shown in FIG. 3 can be encapsulated in an encapsulation body similar to the encapsulation body 150 of the third divider assembly 42.

Generally, and independent of this specific embodiment, an encapsulation body 150 can provide mechanical stability to divider assemblies, e.g. to the third divider assembly 42, so that the risk of damage is reduced when pushing such divider assemblies into the cavity. Suitably encapsulated divider assemblies are less likely to break when pushed into a cavity. Encapsulation can also provide a smooth outer surface to divider assemblies, e.g. to the divider assembly 42, so that there are a smaller number of air voids and smaller air voids in the cavity 30, i.e. in the space between the divider assembly 42 and the inner wall of the cavity 30 after insertion of an encapsulated divider assembly into the cavity 30. A smooth outer surface of a divider assembly generally makes insertion into a cavity 30 easier.

FIG. 5 is a perspective sketch of a second elastic sleeve 2 according to the invention. The second sleeve 2 has a tubular sleeve body 10 of elastic, electrically insulating silicone material. Such a silicone material is commonly in use for the purpose of insulating cable accessories on MV/HV power cables. Alternatively, an EPDM material could be used. The sleeve body 10 forms a receiving space 20 for receiving the inner conductor of a stripped power cable. The receiving space 20 is a central through-hole in the sleeve body 10, it has an elongated cylinder shape and a circular cross section. The symmetry axis of the cylinder defines axial directions, indicated by arrow 100, while radial directions 110 are directions orthogonal to the axial directions 100.

The sleeve 2 is radially expandable, so that it can be pushed over an end portion of a stripped MV/HV power cable, as is described above for the first sleeve 1. The second sleeve 2 is designed for being pushed on an inner conductor of the power cable, where the inner conductor is the/an element of the cable that actually transmits electric voltage and current.

The sleeve 2 comprises a divider assembly 42 which in turn comprises a flexible printed circuit board ("PCB") 52, and discrete resistors 60 mounted on a major surface of the PCB 52. The resistors 60 are electrically connected in series with each other via conductive traces 70 on the PCB 52. A low-voltage contact 130 and a midpoint access contact 140 are arranged on an end portion of the PCB 52, similar to the corresponding contacts described for the divider assemblies 40, 41, 42 shown in FIGS. 2, 3 and 4. A high-voltage contact 82 is arranged on the opposite end portion of the PCB 52. It is suitably adapted for making direct electrical and mechanical contact with the inner conductor of a cable, onto which the sleeve 2 is to be pushed. For making that contact, the high-voltage contact 82 extends, in the long direction of the PCB 52, around the edge of the PCB 52 and covers a portion of the other major surface of the PCB 52, so that the part of the PCB 52 on that other major surface of the PCB 52 contacts the inner conductor mechanically, when the inner conductor is received in the receiving space 20.

Alternatively, the PCB 52 could comprise a separate contact on the other major surface, with that separate contact being connected to the high-voltage contact 82 by so-called vias, which provide electrical paths through the PCB 52 in its thickness direction.

The discrete resistors 60 are arranged on the flexible PCB 52 in a chain. Since the PCB 52 is folded and has a Z-shape, also the resistors 60 are arranged in a Z-shaped chain. One end of the Z-shaped or folded chain of resistors 60 is arranged in the vicinity of the receiving space 20, this end of the chain may be called the "high-voltage end". The opposed end, the "low-voltage end", of the Z-shaped or folded chain of resistors 60 is arranged in the vicinity of the radially outer surface of the sleeve body 10.

The divider assembly 42 is arranged in a cavity 32, formed in the sleeve 2. The cavity 32 is delimited by a cavity wall 190. The cavity 32 is formed during manufacturing of the sleeve 2: The material of the sleeve body 10 is moulded, in a suitable tool, to form the sleeve body 10, such that the divider assembly 42 is overmolded directly with the sleeve moulding material. The space in the sleeve body 10 which is not filled by the sleeve moulding material during the moulding process, because it is occupied by the divider assembly 42, forms the cavity 32. Due to the manufacturing process of the sleeve body 10, the cavity 32 is roughly the same size and shape as the divider assembly 42, so that the outer surface of the divider assembly 42 is in direct contact with the cavity wall 190. In sleeves 2 manufactured in this way, essentially no voids are present which could promote electric discharges between the divider assembly 42 and the cavity wall 190. It is to be noted that in FIG. 5 the cavity wall 190 has been drawn distinctly separately from the surface of the divider assembly 42 only for greater clarity. In reality, the gap between these elements is much smaller than drawn in FIG. 5.

The high-voltage end portion of the PCB 52 (i.e. the end portion in the vicinity of the high-voltage contact 82) protrudes partially into the receiving space 20. This facilitates a good mechanical and electrical contact between the high-voltage contact 82 and the inner conductor over which the sleeve 2 is pushed.

The low-voltage end portion of the PCB 52 (i.e. the end portion in the vicinity of the low-voltage contact 130) protrudes partially from the radially outer surface of the sleeve body 10. The low-voltage contact 130 and the midpoint access contact 140 are thereby easily accessible from outside the sleeve 2 for making electrical contact with them, e.g. for soldering signal wires to them.

A shielding layer 200 is applied circumferentially on the radially outer surface of the sleeve body 10, which is held on electrical ground potential. It helps keeping parasitic capacitances constant. This improves the accuracy of the voltage sensor, of which the voltage divider formed by the resistors 60 is a central element.

Instead of being folded into a Z-shape, the divider assembly and the chain of discrete impedance elements can have a spiral shape. This is shown in FIG. 6 in a perspective sketch. This third sleeve 3 according to the invention is similar to the second sleeve 2 shown in FIG. 5. The divider assembly 43 again comprises a flexible PCB 53 with resistors 60 mounted on it. One difference, however, is that the PCB 53 is arranged in a coaxial spiral around the receiving space 20. The low-voltage end portion of the PCB 53 protrudes partially from the radially outer surface sleeve body 10, so that the low-voltage contact 130 and the midpoint access contact 140 are accessible from outside the sleeve body 10. The high-voltage end portion of the PCB 53 protrudes partially into the receiving space 20 for making contact with the inner conductor onto which the third sleeve 3 is pushed.

Like in the second sleeve 2, a shielding layer 200 is applied circumferentially on the outer surface of the sleeve body 10, which is held on electrical ground potential.

Also the third sleeve 3 is formed by a moulding process, where the sleeve material is moulded around the divider assembly 43, thereby forming a cavity which fits tightly around the divider assembly 43.

The sleeves according to the present disclosure can be used in MV/HV cable accessories like, for example, in cable terminations, cable splices, or in connectorized cable plugs.

FIG. 7 is a partial longitudinal section of a connectorized plug with a sleeve according to the present invention, applied to an end of a power cable. The dimensions of the various elements are not drawn to scale to enhance clarity of the Figure.

The power cable 210 is not shown in a sectional view, but as it would appear to an observer. It is stripped down in steps, so that its various layers are visible. It comprises a cable sheath 220 as its radially outermost layer, followed by a conductive layer 230, which, in turn, is applied on a main insulation layer 240.

This main insulation layer 240 surrounds the inner conductor 250, which extends farthest to the right. A conductive cable lug 260 is fixed to the inner conductor 250.

The cable 210 is surrounded by an elastic sleeve 4 according to the present disclosure. This fourth sleeve 4 comprises a sleeve body 10. The sleeve body 10 comprises a main insulation layer 305, being the outermost layer of the sleeve 4, and a stress control layer 307. The sleeve body 10 forms a cylindrical receiving space 20, extending lengthwise in axial direction 100, in which the cable 210 is arranged. The sleeve 4 also comprises a cylindrical cavity 30, extending through the entire sleeve 4 in axial direction 100, parallel to the long direction of the receiving space 20, and delimited by a cavity wall 290. A divider assembly 44 is arranged in the cavity 30. It comprises a plurality of capacitors (not shown), arranged in a straight chain and connected in series. The last capacitor in the chain, next to the high-voltage end portion 270 of the divider assembly 44, is electrically connected to the inner conductor 250 via a high-voltage wire 180 and the cable lug 260. At the low-voltage end portion 280 of the divider assembly 44, a ground wire 160 and a signal wire 170 are connected to the chain of capacitors, similar to what is shown in FIG. 4 for resistors, so that a signal can be picked up from the midpoint access contact of the divider assembly 44, which permits sensing of the voltage of the inner conductor 250 versus ground. The inner diameter of the cavity wall 290 is slightly larger than the outer diameter of the divider assembly 44. The space between the cavity wall 290 and the divider assembly 44 is filled with a deformable, electrically insulating voidfilling material 300, namely a silicone gel.

The sleeve 4 is a shrinkable sleeve. Before application on a cable end, the sleeve body 10 is held in a radially expanded state by a plastic core (not shown). When the core is removed, the sleeve body 10 strives to return to its normal, unexpanded shape and contracts radially. The sleeve 4 is positioned over a cable end before shrinkage, and is then shrunk down over the cable end in an appropriate axial position.

The sleeve 4 is surrounded by a so-called elbow plug 310, by which the cable 210 can be connected, via the cable lug 260, to electrical installations like, for example, to switch gears. This elbow plug 310 comprises, amongst other elements, a plug isolation layer 320 and a conductive high-voltage electrode 330. The outer surface of the elbow plug 310 is formed by an electrically conductive layer 340.

The invention claimed is:

1. Elastic sleeve for electrically insulating a HV/MV power conductor in a power network, the elastic sleeve comprising:
   a) an elastic sleeve body for insulating the power conductor, the sleeve body comprising one or more layers each comprising an elastic material, the sleeve body being radially shrinkable around the power conductor or radially expandable when pushed over the power conductor;
   b) a receiving space, formed in the sleeve body, for receiving a section of the power conductor such that the sleeve body surrounds the power conductor;
   c) a cavity, formed in the sleeve body, having at least one opening and delimited by a cavity wall formed within the elastic material of a sleeve body layer; and
   d) a divider assembly, arranged, at least partially, in the cavity and comprising a plurality of discrete impedance elements, of which at least two of said impedance elements are electrically connected in series such as to be operable as a voltage divider for sensing a voltage of an inner conductor of the power conductor.

2. Elastic sleeve according to claim 1, wherein the plurality of discrete impedance elements comprises one or more resistors, and/or one or more capacitors and/or one or more inductances.

3. Elastic sleeve according to claim 1, wherein the plurality of discrete impedance elements comprises a plurality of capacitors, and wherein a respective resistor is electrically connected in parallel to at least one of the plurality of capacitors.

4. Elastic sleeve according claim 1, wherein the plurality of discrete impedance elements is arranged in a straight chain or in a Z-shaped chain.

5. Elastic sleeve according claim 1, further comprising a shielding layer, arranged around the plurality of discrete impedance elements.

6. Elastic sleeve according to claim 1, wherein the plurality of discrete impedance elements is arranged on a flexible printed circuit board.

7. Elastic sleeve according to claim 1, wherein the divider assembly comprises an encapsulation body, in which the plurality of discrete impedance elements is encapsulated.

8. Elastic sleeve according to claim 1, wherein the divider assembly is removable from the cavity.

9. Elastic sleeve according to claim 1, further comprising
   e) a high-voltage contact for electrical connection of a first discrete impedance element of the plurality of discrete impedance elements to an inner conductor of the power conductor, and/or
   f) a low-voltage contact for electrical connection of a second discrete impedance element of the plurality of discrete impedance elements to electrical ground, accessible from outside the elastic sleeve.

10. Elastic sleeve according to claim 1, wherein the cavity has an elongated shape and extends longitudinally in a first direction, and wherein the receiving space has an elongated shape and extends longitudinally in a second direction, and wherein the first direction is parallel to the second direction within an angle of +/−10°.

11. Elastic sleeve according to claim 1, further comprising an electrically insulating voidfilling material, arranged in the cavity, wherein the voidfilling material is arranged between at least a portion of the divider assembly and at least a portion of the cavity wall such as to fill a space between the divider assembly and the cavity wall.

12. Elastic sleeve according to claim 1, wherein the voidfilling material consists of a mastic or a gel, in particular a silicone gel.

13. Power network comprising a HV/MV power conductor insulated by an elastic sleeve according to claim 1.

14. Kit of parts for being assembled to form an elastic sleeve according to claim 1, comprising
   a) an elastic sleeve body according to claim 1; and
   b) a divider assembly according to claim 1, wherein the divider assembly is arrangeable in the cavity.

15. Kit of parts according to claim 14, wherein the plurality of discrete impedance elements comprises a plurality of capacitors, and wherein a respective resistor is electrically connected in parallel to at least one of the plurality of capacitors.

16. Kit of parts according to claim 14, further comprising
   c) an electrically insulating voidfilling material, adapted for being arranged in the cavity such that the voidfilling material is arranged between at least a portion of the divider assembly and at least a portion of the cavity wall such as to fill a space between the divider assembly and the cavity wall.

17. Elbow plug or cable splicing device or termination or separable connector for use with a MV/HV cable, comprising an elastic sleeve according to claim 1.

18. Method of applying an elastic sleeve on a MV/HV power conductor, the method comprising the following steps, in any sequence:
   a) providing a kit of parts according to claim 14 and providing a MV/HV power conductor;
   b) arranging a section of the power conductor in the receiving space of the sleeve body;
   c) arranging the divider assembly in the cavity of the sleeve body.

19. Elastic sleeve according to claim 1, wherein at least two of the discrete impedance elements are fully disposed within the cavity.

20. Elastic sleeve according to claim 1, wherein the cavity extends longitudinally through the sleeve body.

* * * * *